United States Patent [19]
Merrill

[11] Patent Number: 5,841,176
[45] Date of Patent: Nov. 24, 1998

[54] ACTIVE PIXEL SENSOR CELL THAT MINIMIZES LEAKAGE CURRENT

[75] Inventor: Richard Billings Merrill, Woodside, Calif.

[73] Assignee: Foveonics, Inc., Cupertino, Calif.

[21] Appl. No.: 850,604

[22] Filed: May 2, 1997

Related U.S. Application Data

[63] Continuation-in-part of Ser. No. 664,191, Jun. 10, 1996, abandoned, which is a continuation-in-part of Ser. No. 609,566, Mar. 1, 1996.

[51] Int. Cl.$^6$ .......................... H01L 27/146; H01L 31/09; H01L 31/0352
[52] U.S. Cl. .......................... 257/446; 257/547; 257/291; 257/292
[58] Field of Search .................................... 257/128, 256, 257/290–293, 439, 446, 547

[56] References Cited

U.S. PATENT DOCUMENTS

| | | | |
|---|---|---|---|
| 3,551,761 | 12/1970 | Ruoff | 257/446 |
| 3,649,887 | 3/1972 | Keller | 257/547 |
| 4,450,466 | 5/1984 | Nishizawa et al. | 257/292 |
| 4,454,526 | 6/1984 | Nishizawa et al. | 257/292 |
| 4,733,286 | 3/1988 | Matsumoto | 257/291 |
| 5,070,032 | 12/1991 | Yuan et al. | 437/43 |
| 5,101,253 | 3/1992 | Mizutani et al. | 257/290 |
| 5,191,398 | 3/1993 | Mutoh | 257/216 |
| 5,210,433 | 5/1993 | Ohsawa et al. | 257/250 |
| 5,289,023 | 2/1994 | Mead | 257/291 |
| 5,293,051 | 3/1994 | Mariyama et al. | 257/128 |
| 5,369,291 | 11/1994 | Swanson | 257/128 |
| 5,371,397 | 12/1994 | Maegawa et al. | 257/432 |
| 5,432,551 | 7/1995 | Matsunaga | 348/299 |
| 5,481,124 | 1/1996 | Kozuka et al. | 257/185 |
| 5,488,239 | 1/1996 | Jung | 257/231 |
| 5,506,429 | 4/1996 | Tanaka et al. | 257/233 |
| 5,552,619 | 9/1996 | Bergemont et al. | 257/291 |
| 5,566,044 | 10/1996 | Bergemont et al. | 361/321.1 |
| 5,576,562 | 11/1996 | Konuma | 257/232 |
| 5,614,744 | 3/1997 | Merrill | 257/291 |
| 5,637,893 | 6/1997 | Furumiya | 257/222 |

FOREIGN PATENT DOCUMENTS

| | | | |
|---|---|---|---|
| 157-376 A | 10/1985 | European Pat. Off. | 257/232 |
| 62-216262 A | 9/1987 | Japan | 257/232 |

OTHER PUBLICATIONS

Fossum, E., "Active–pixel Sensors Challenge CCDs," Technology Guide: Detector Handbook, *Laser Focus World*, pp. 83–87, Jun. 1993.

Mendis, S. et al., "Progress in CMOS Active Pixel Image Sensors," *SPIE* vol. 2172, pp. 19–29, paper presented at a Conference on Feb. 7–8, 1994 in San Jose, CA.

Kawashima, H. et al., "A ¼ Inch Format 250K Pixel Amplified MOS Image Sensor Using CMOS Process," *IEDM* (1993) pp. 575–578.

Dickinson, A. et al., "TP 13.5: A 256×256 CMOS Active Pixel Image Sensor with Motion Detection," *IEEE* (1995) International Solid–State Circuits Conf., Feb. 16, 1995.

U.S. application No. 08/438,347, Bergemont et al., filed May 10, 1995.

U.S. application No. 08/509,421, Merrill, filed Jul. 31, 1995.

*Primary Examiner*—Jerome Jackson
*Attorney, Agent, or Firm*—Limbach & Limbach L.L.P.

[57] ABSTRACT

Isolation between the heavily-doped active regions of an active pixel sensor cell is provided by utilizing a series of isolation regions which have a doping concentration that is approximately equal to the doping concentration of a low-density drain (LDD) region. A first isolation region of the series, which has the same conductivity type as the active regions, is formed to adjoin a first active region. A second isolation region of the series, which has the opposite conductivity type as the active regions, is formed to adjoin the first isolation region. A third isolation region, which has the same conductivity type as the active regions, is formed to adjoin the second isolation region and a second active region.

10 Claims, 7 Drawing Sheets

ACTIVE PIXEL SENSOR CELL THAT MINIMIZES LEAKAGE CURRENT

RELATED APPLICATIONS

This application is a continuation-in-part of Ser. No. 08/664,191 filed Jun. 10, 1996 now abandoned by Richard Merrill for Active Pixel Sensor Cell That Minimizes Leakage Current, which is a continuation-in-part of Ser. No. 08/609,566 filed Mar. 1, 1996 pending by Richard Merrill for Low Stress Photodiode with Reduced Junction Leakage.

BACKGROUND OF THE INVENTION

1. Field of the Invention

The present invention relates to active pixel sensor cells and, more particularly, to an active pixel sensor cell that minimizes leakage current.

2. Description of the Related Art

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use active pixel sensor cells to convert a pixel of light energy into an electrical signal. With active pixel sensor cells, a conventional photodiode is typically combined with a number of active transistors which, in addition to forming an electrical signal, provide amplification, readout control, and reset control.

Figure 1:
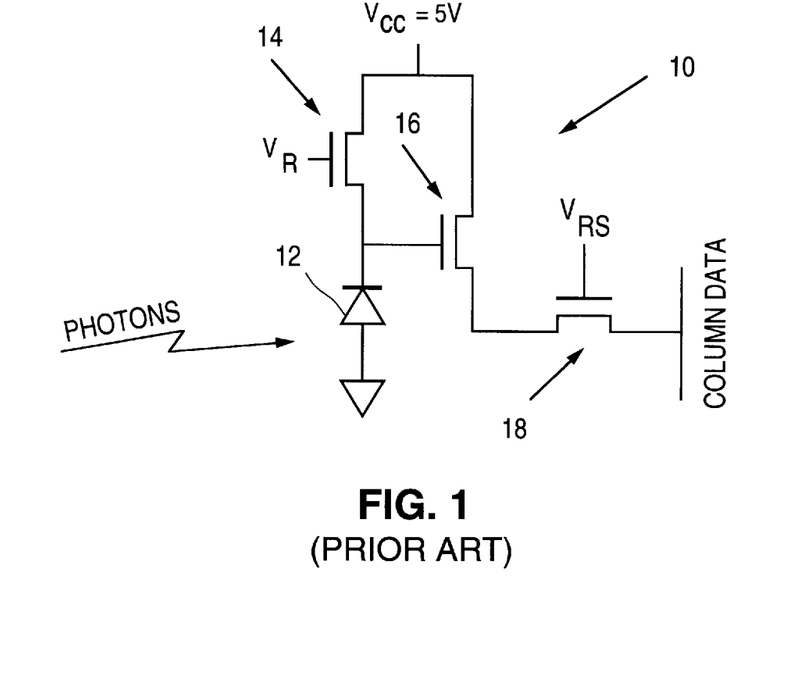
FIG. 1 is a schematic diagram illustrating a conventional CMOS active pixel sensor cell 10.

FIG. 1 shows a schematic diagram that illustrates a conventional CMOS active pixel sensor cell 10. As shown in FIG. 1, cell 10 includes a photodiode 12, a reset transistor 14, whose source is connected to photodiode 12, a source-follower transistor 16, whose gate is connected to photodiode 12, and a row-select transistor 18, whose drain is connected in series to the source of source-follower transistor 16.

Operation of active pixel sensor cell 10 is performed in three steps: a reset step, where cell 10 is reset from the previous integration cycle; an image integration step, where the light energy is collected and converted into an electrical signal; and a signal readout step, where the signal is read out.

As shown in FIG. 1, during the reset step, the gate of reset transistor 14 is briefly pulsed with a reset voltage $V_R$ (5 volts). The reset voltage $V_R$ turns on reset transistor 14 which pulls up the voltage on photodiode 12 and the gate of source-follower transistor 16 to an initial transfer voltage.

The initial transfer voltage placed on the gate of source-follower transistor 16 also defines an initial intermediate voltage on the source of source-follower transistor 16 which is one threshold voltage drop less than the initial transfer voltage.

Immediately after the gate of reset transistor 14 has been pulsed, the gate of row-select transistor 18 is pulsed with a row-select voltage $V_{RS}$. The row-select voltage $V_{RS}$ on the gate of row-select transistor 18 causes the initial intermediate voltage on the source of source-follower transistor 16 to appear on the source of row-select transistor 18 as an initial integration voltage which, in turn, is read out and stored by an imaging system.

During integration, light energy, in the form of photons, strikes photodiode 12, thereby creating a number of electron-hole pairs. Photodiode 12 is designed to limit recombination between the newly formed electron-hole pairs.

As a result, the photogenerated holes are attracted to the ground terminal of photodiode 12, while the photogenerated electrons are attracted to the positive terminal of photodiode 12 where each additional electron reduces the voltage on photodiode 12.

Thus, at the end of the integration step, the potential on photodiode 12 and the gate of source-follower transistor 16 will have been reduced to a final transfer voltage where the amount of the reduction represents the intensity of the received light energy. As above, the final transfer voltage on the gate of source-follower transistor 16 defines a final intermediate voltage on the source of source-follower transistor 16.

Following the image integration period, the final intermediate voltage on the source of source-follower transistor 16 is then read out as a final integration voltage by again pulsing the gate of row-select transistor 18 with the row-select voltage $V_{RS}$. As a result, a collected voltage which represents the total charge collected by cell 10 can be determined by subtracting the final integration voltage from the initial integration voltage.

Figure 2:
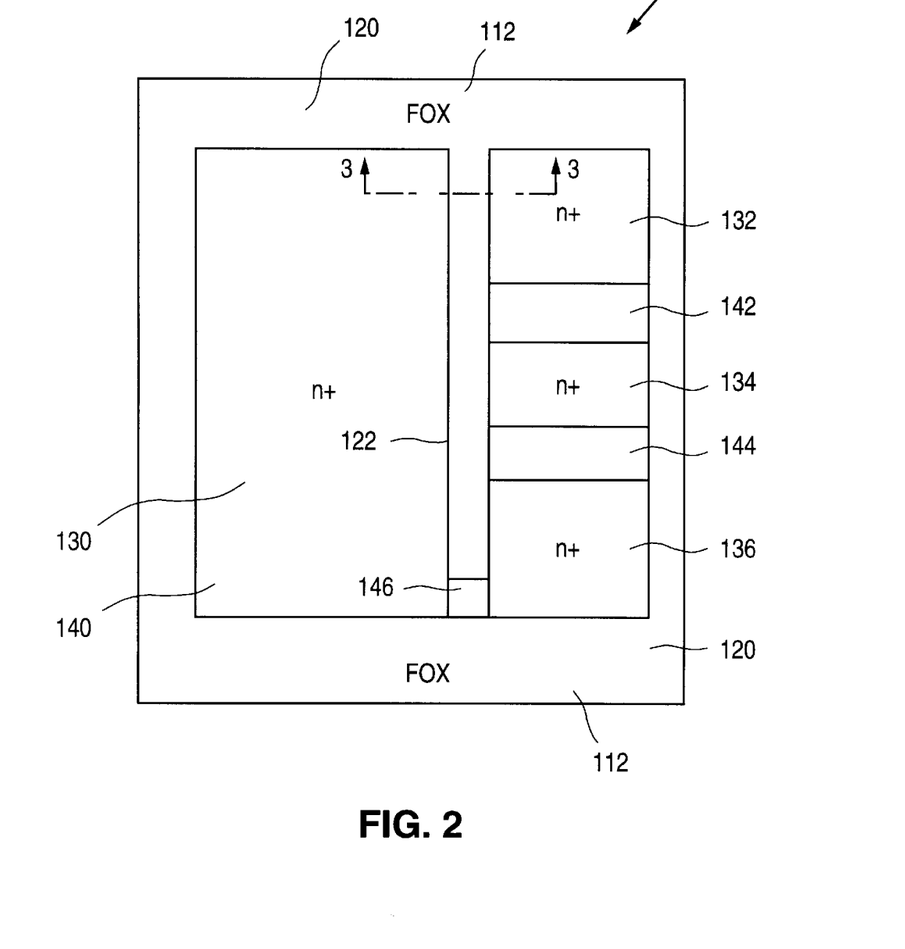
FIG. 2 is a plan view illustrating a substrate level layout 100 of cell 10 of FIG. 1.
Figure 3:
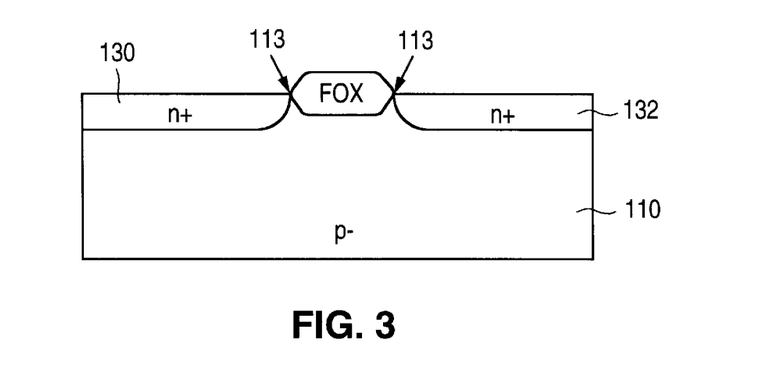
FIG. 3 is a cross-sectional view taken along line 3—3 of FIG. 2.

FIG. 2 shows a plan view that illustrates a substrate level layout 100 of cell 10 of FIG. 1. FIG. 3 is a cross-sectional view taken along line 3—3 of FIG. 2.

As shown in FIGS. 2 and 3, cell 10 of layout 100 is formed on a substrate 110 that includes an isolation region 112 defined by an outer wall portion 120 that encloses a plurality of active regions within substrate 110, and a protruding wall portion 122 that extends inward from the outer wall portion 120.

The protruding wall portion 122, in turn, divides the plurality of active regions into a first active region 130 on one side of wall portion 122, and second, third, and fourth active regions 132, 134, and 136 on an opposite side of wall portion 122. The first active region 130 of substrate 110 is doped with an n-type material to form an n+ photodiode 140, while the second, third, and fourth active regions 132, 134, and 136 are doped with an n-type material to form n+ source and drain regions for the transistors of cell 10.

Specifically, with reference to FIGS. 1 and 2, active region 132 functions as the source of select transistor 18, active region 134 functions as the source of sense transistor 16 and the drain of select transistor 18, and active region 136 functions as the drains for reset transistor 14 and sense transistor 16.

In addition, the second and third active regions 132 and 134 are separated by a select channel region 142, the third and fourth active regions 134 and 136 are separated by a sense channel region 144, and the first and fourth active regions 130 and 136 are separated by a reset channel region 146 defined between an end of the protruding wall portion 122 and the outer wall portion 120.

Further, isolation is provided by forming a field oxide region FOX in isolation region 112 of substrate 110. As shown, field oxide region FOX includes the well-known bird's beak 113 that results from the lateral expansion of the oxide during fabrication.

One problem with cell 10, however, is that cell 10 suffers from a leakage current which is most pronounced in the region where the active area contacts the bird's beak 113 of field oxide region FOX.

The leakage current in the bird's beak region is widely believed to be caused by lattice defects that occur during the formation of field oxide region FOX. These lattice defects create mid-band energy states that allow electrons from thermally-generated electron-hole pairs to more readily transition from the valence band to the conduction band. Once in the conduction band, these electrons contribute to the total photogenerated electrons, thereby adding an error term.

Figure 4:
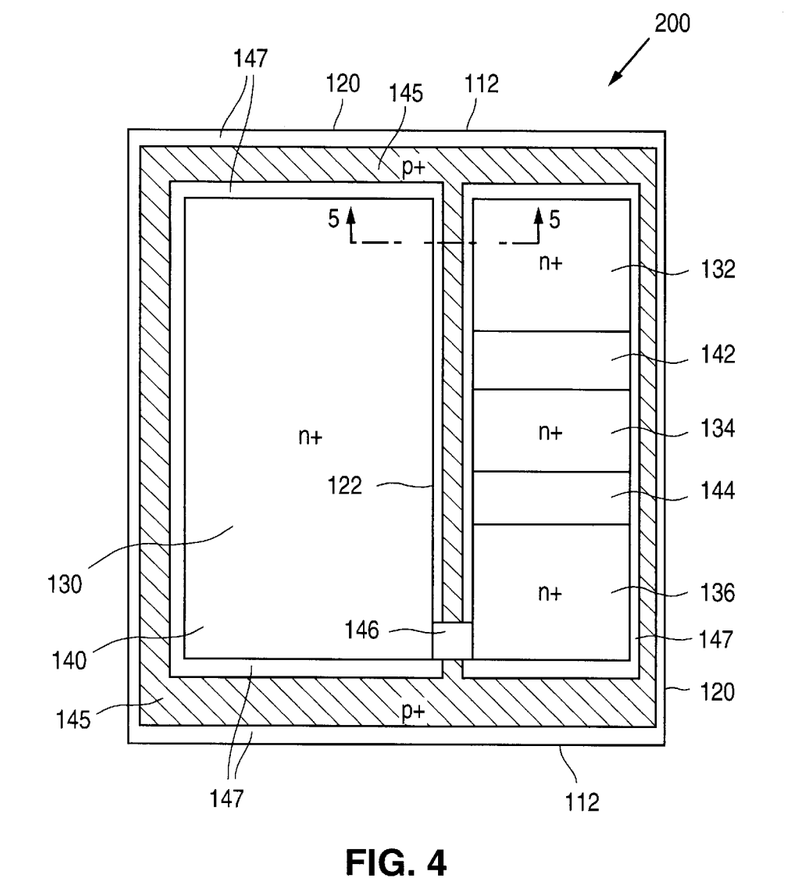
FIG. 4 is a plan view of a substrate level layout 200 of cell 10 of FIG. 1 illustrating a first technique for reducing the leakage current in the bird's beak region of field oxide region FOX.
Figure 5:
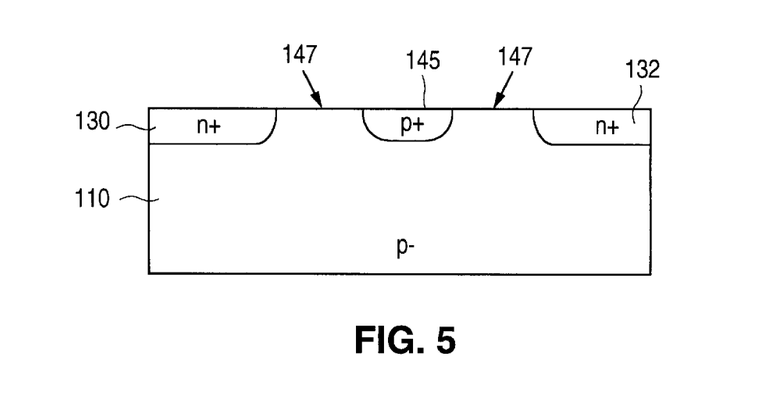
FIG. 5 is a cross-sectional view taken along line 5—5 of FIG. 4.

FIG. 4 shows a plan view of a substrate level layout 200 of cell 10 of FIG. 1 that illustrates a first technique for reducing the leakage current in the bird's beak region of field oxide region FOX. FIG. 5 is a cross-sectional view taken along line 5—5 of FIG. 4. As shown, layout 200 is structurally similar to layout 100 of FIG. 2 and, as a result, utilizes the same reference numerals to designate the structures which are common to both layouts.

As shown in FIGS. 4 and 5, layout 200 principally differs from layout 100 in that isolation is provided by a p+ region 145, which is positioned between surface regions 147 of substrate 110 in isolation region 112, in lieu of the field oxide region FOX of layout 100.

Although p+ region 145 provides satisfactory isolation, surface regions 147 of substrate 110 are also sources of a significant leakage current that results from defects at the substrate surface. These defects are typically caused by interface states that result from the use of an overlying layer of oxide.

In addition, surface regions 147 can not be eliminated by expanding the width of p+ region 145 to contact adjoining active regions (such as regions 130 and 132 in FIG. 5) because the resulting p+/n+ junction results in a strong electric field that also leads to a large leakage current.

Figure 6:
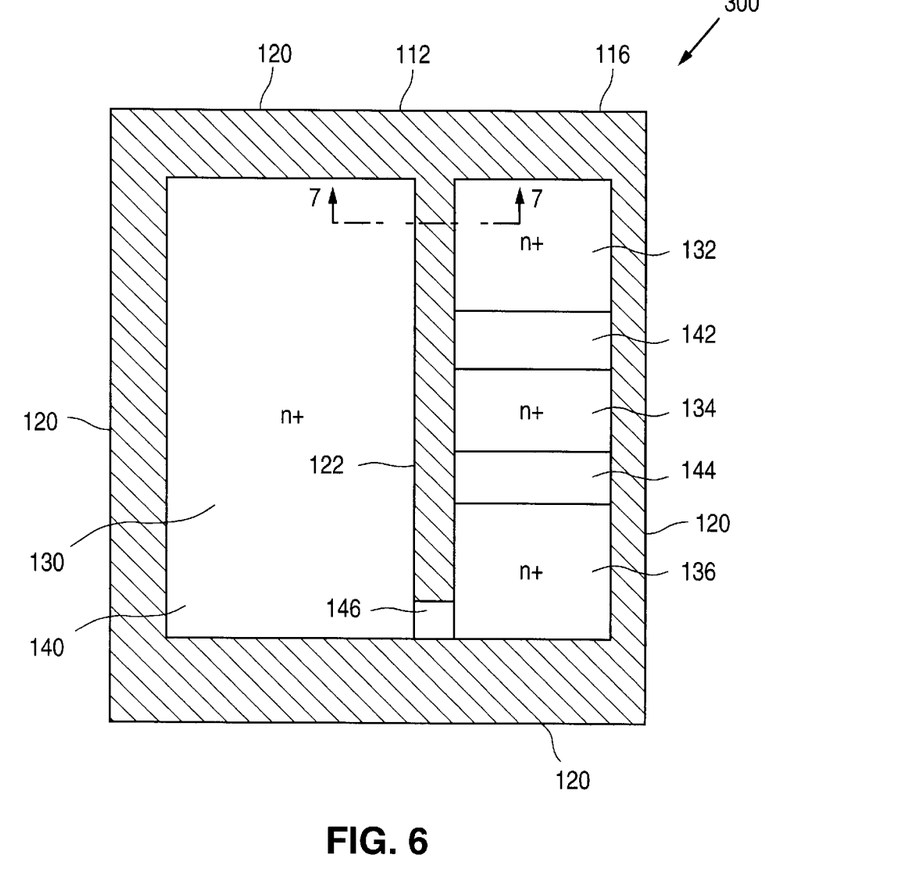
FIG. 6 is a plan view of a substrate level layout 300 of cell 10 of FIG. 1 illustrating a second technique for reducing the leakage current in the bird's beak region of field oxide region FOX.
Figure 7:
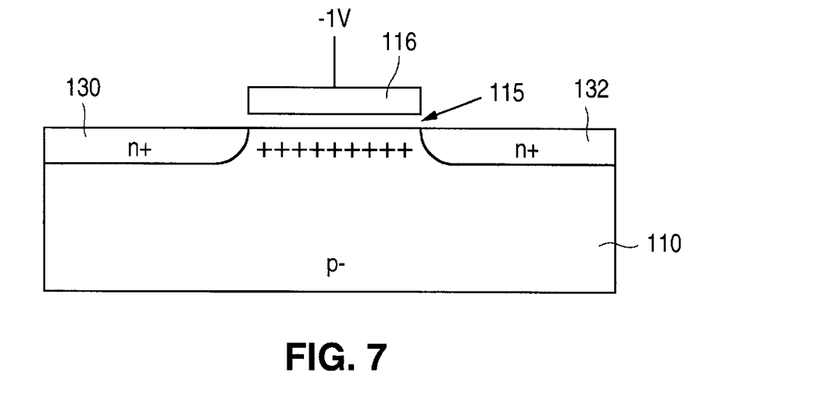
FIG. 7 is a cross-sectional view taken along line 7—7 of FIG. 6.

FIG. 6 shows a plan view of a substrate level layout 300 of cell 10 of FIG. 1 that illustrates a second technique for reducing the leakage current in the bird's beak region of field oxide region FOX. FIG. 7 is a cross-sectional view taken along line 7—7 of FIG. 6. As shown, layout 300 is structurally similar to layout 100 of FIG. 2 and, as a result, utilizes the same reference numerals to designate the structures which are common to both layouts.

As shown in FIGS. 6 and 7, layout 300 principally differs from layout 100 in that isolation is provided by a polysilicon (poly) electrode 116, which is formed on a oxide layer 115 over isolation region 112, in lieu of the field oxide region FOX.

Specifically, isolation is provided by applying a negative voltage to poly electrode 116 which, in turn, causes holes to accumulate at the surface of isolation region 112. Although this approach, which is the subject of the '566 application, significantly reduces the leakage current, it is frequently a nuisance to provide a negative voltage. In addition, as discussed in the '191 application, single-poly implementations require more surface area, while double-poly implementations are more complex.

Thus, there is a need for an isolation technique that substantially reduces the leakage current without requiring the provision of a negative voltage.

SUMMARY OF THE INVENTION

Conventionally, the accuracy of an active pixel sensor cell is limited by a leakage current which is most pronounced in the region where the active areas contact the bird's beak of a field oxide region. The present invention, however, substantially reduces the leakage current by utilizing a series of low-density regions, which provide isolation and surface passivation, in lieu of the field oxide region.

In the present invention, an active pixel sensor cell, which is formed on a silicon substrate of a first conductivity type, includes a plurality of spaced-apart active regions of a second conductivity type which are formed in the substrate. The active regions include a photodiode region and a row-select region where the photodiode and row-select regions each have a doping concentration.

In accordance with the present invention, the cell also includes first, second, and third isolation regions. The first isolation region, which is of the second conductivity type, is formed in the substrate to adjoin the photodiode region, and has a doping concentration that is substantially less than the doping concentration of the photodiode region.

The second isolation region, which is of the first conductivity type, is formed in the substrate to adjoin the first isolation region, and has a doping concentration which is approximately the same as the doping concentration of the first isolation region.

The third isolation region, which is of the second conductivity type, is formed in the substrate to adjoin the second isolation region and the row-select region, and has a doping concentration which is approximately the same as the doping concentration of the first isolation region.

A better understanding of the features and advantages of the present invention will be obtained by reference to the following detailed description and accompanying drawings which set forth an illustrative embodiment in which the principals of the invention are utilized.

DETAILED DESCRIPTION

Figure 8:
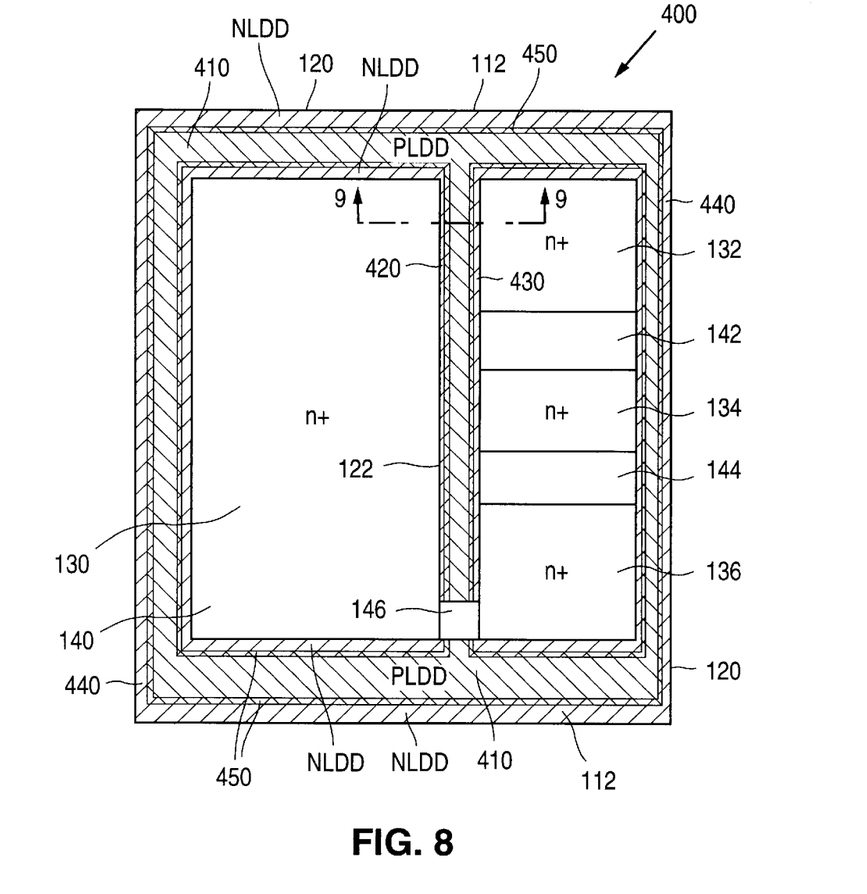
FIG. 8 is a plan view of a substrate level layout 400 of cell 10 of FIG. 1 illustrating a technique for reducing the leakage current in the bird's beak region of field oxide region FOX in accordance with the present invention.

FIG. 8 shows a plan view of a substrate level layout 400 of cell 10 of FIG. 1 that illustrates a technique for reducing the leakage current in the bird's beak region of field oxide region FOX in accordance with the present invention.

Figure 9:
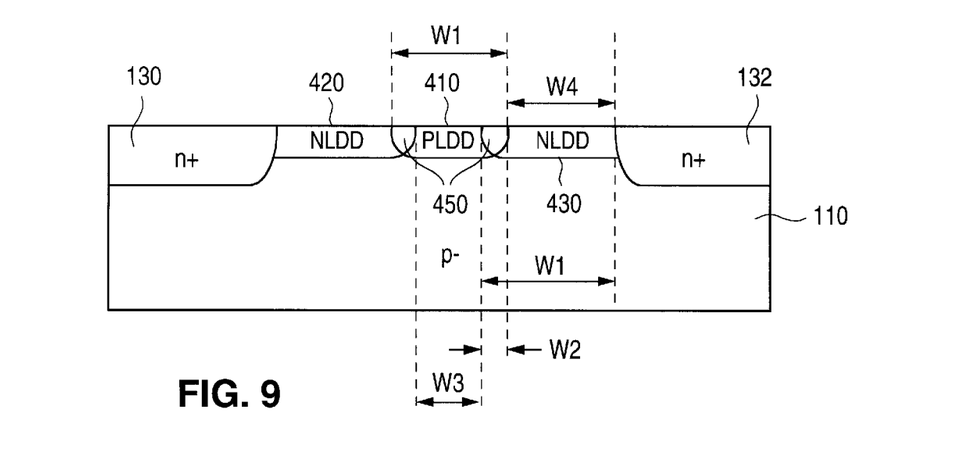
FIG. 9 is a cross-sectional view taken along line 9—9 of FIG. 8.

FIG. 9 shows a cross-sectional view taken along line 9—9 of FIG. 8. As shown, layout 400 is structurally similar to layout 100 of FIG. 2 and, as a result, utilizes the same reference numerals to designate the structures which are common to both layouts.

In accordance with the present invention, layout 400 principally differs from layout 100 of FIG. 2 in that isolation is provided by a series of low-density regions in lieu of the field oxide region FOX. As shown in FIGS. 8 and 9, a p-type low-density drain (PLDD) region 410 is formed in isolation region 112 of substrate 110 between first and second n-type low-density drain (NLDD) regions 420 and 430, first and third NLDD regions 420 and 440, and second and third NLDD regions 430 and 440 which are also formed in isolation region 112 of substrate 110.

In operation, PLDD region 410 provides surface isolation between active areas, such as active areas 130 and 132, in the same way that p+ region 145 of FIGS. 4 and 5 provides surface isolation. In addition, however, NLDD regions 420, 430, and 440 provide surface passivation by adjoining PLDD region 410 and the adjacent active regions, such as active regions 130 and 132 of FIG. 5, respectively.

In the preferred embodiment, the doping concentrations of PLDD and NLDD regions 410, 420, 430, and 440 are set to be approximately the same and, for a 0.35 micron photolithographic process, fall within the range of approximately $1\times10^{13}$ to $1\times10^{14}$ atoms/cm$^3$. As a result, the surface doping levels between active areas, such as active areas 130 and 132, are high enough to provide good passivation for the surface states, as well as providing a good channel stop.

In addition, the breakdown voltage between PLDD region 410 and NLDD regions 420, 430, and 440 is about 10 V with a 0.35 micron photolithographic process. As a result, the electric field across the PLDD/NLDD junctions is low enough so that the leakage current across the junction is substantially less than the leakage current that exists with field oxide regions. As a result, PLDD and NLDD regions 410, 420, 430, and 440 are overlapped to form an overlap region 450, thereby ensuring that no region of undoped surface silicon is exposed to an overlying oxide or other layer.

Further, when formed with a 0.35 micron photolithographic process, the LDD regions 410, 420, 430, and 440 are formed to have widths W1, which are approximately 0.6 microns wide, while overlap region 450 is formed to have a width W2 which is approximately 0.1 microns wide. As a result, the effective width W3 of PLDD region 410 is approximately 0.4 microns wide, while the effective widths W4 of NLDD regions 420, 430, and 440 are approximately 0.5 microns wide. Alternately, other widths can also be utilized.

It is noted that forming PLDD region 410 to directly contact the active regions, such as active regions 130 and 132, results in a much lower breakdown voltage (on the order of 5 V) when formed with a 0.35 micron photolithographic process. Thus, directly contacting PLDD region 410 to the active regions would result in an unacceptably high leakage current which is larger than the leakage current associated with the field oxide regions.

Figure 10:
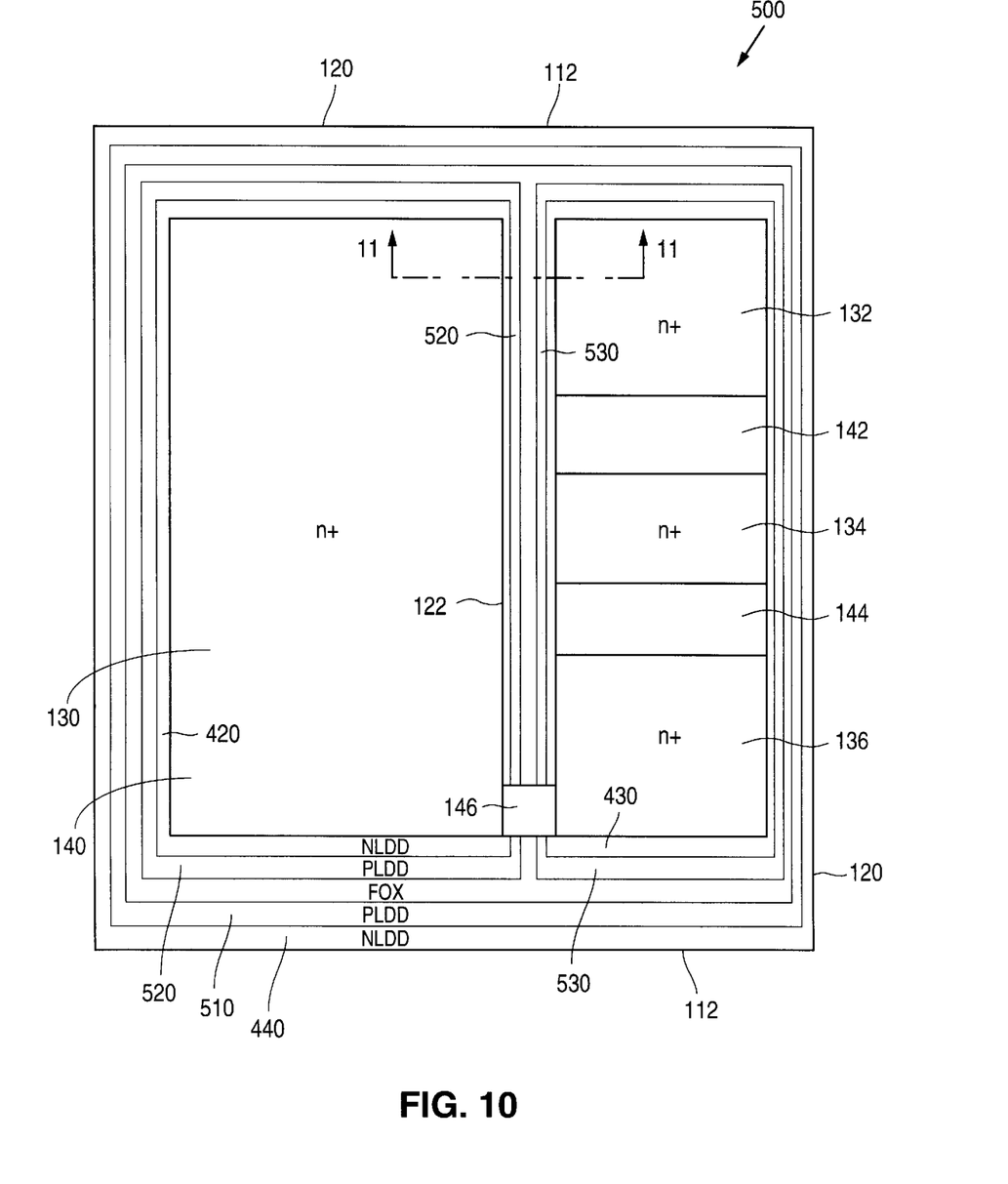
FIG. 10 is a plan view of a substrate level layout 500 of cell 10 of FIG. 1 illustrating an alternate technique for reducing the leakage current in the bird's beak region of field oxide region FOX in accordance with the present invention.

FIG. 10 shows a plan view of a substrate level layout 500 of cell 10 of FIG. 1 that illustrates an alternate technique for reducing the leakage current in the bird's beak region of field oxide region FOX in accordance with the present invention.

Figure 11:
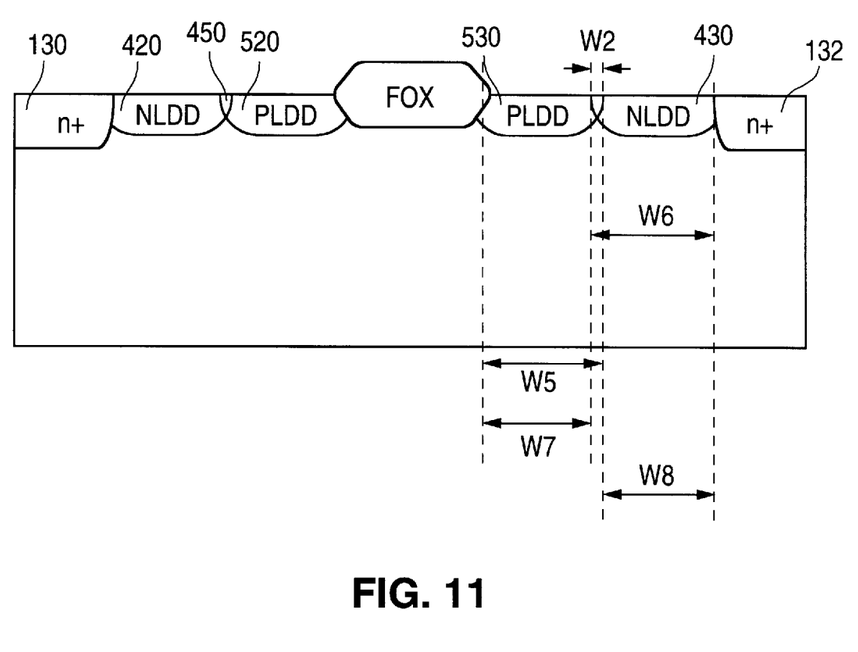
FIG. 11 is a cross-sectional view taken along line 11—11 of FIG. 10.

FIG. 11 shows a cross-sectional view taken along line 11—11 of FIG. 10. As shown, layout 500 is structurally similar to layout 400 of FIG. 8 and, as a result, utilizes the same reference numerals to designate the structures which are common to both layouts.

As shown in FIGS. 10 and 11, layout 500 principally differs from layout 400 of FIG. 8 in that a field oxide region FOX is formed between first and second PLDD regions 510 and 520, first and third PLDD regions 510 and 530, and second and third PLDD regions 520 and 530.

Further, when formed with a 0.35 micron photolithographic process, the PLDD regions 510, 520, and 530 are formed to have widths W5 which are approximately 0.3 microns wide, while the NLDD regions 420, 430, and 440 are formed to have widths W6 which are approximately 0.4 microns wide. In PATENT addition, overlap region 450 continues to have a width W2 is approximately 0.1 microns wide. As a result, the effective widths W7 of PLDD regions 510, 520, and 530 are approximately 0.2 microns wide, while the effective widths W8 of NLDD regions 420, 430, and 440 are approximately 0.5 microns wide. Alternately, other widths can also be utilized.

In operation, electrons which are formed in the bird's beak area of field oxide region FOX are most likely to recombine with holes in the surrounding PLDD regions rather than being collected by the n+ junctions as is the case when an n+ region adjoins a field oxide region.

The advantage provided by utilizing field oxide region FOX between PLDD regions 510, 520, and 530 is that conventional CMOS rules require poly contacts to be formed over field oxide regions.

It should be understood that various alternatives to the embodiment of the invention described herein may be employed in practicing the invention. For example, when two p+ active areas are used, isolation can be provided by utilizing an NLDD region which is formed between two PLDD regions that contact the p+ active regions.

Thus, it is intended that the following claims define the scope of the invention and that methods and structures within the scope of these claims and their equivalents be covered thereby.

What is claimed is:

1. An active pixel sensor cell formed on a semiconductor substrate of a first conductivity type, the cell comprising:

a plurality of spaced-apart active regions of a second conductivity type formed in the substrate, the active regions including a photodiode region and a row-select region, the photodiode and row-select regions each having a doping concentration;

a first isolation region of the second conductivity type formed in the substrate to adjoin the photodiode region, the first isolation region having a doping concentration substantially less than the doping concentration of the photodiode region;

a second isolation region of the first conductivity type formed in the substrate to adjoin the first isolation region, the second isolation region having a doping concentration which is approximately the same as the doping concentration of the first isolation region; and a third isolation region of the second conductivity type formed in the substrate to adjoin the second isolation region and the row-select region, the third isolation region having a doping concentration which is approximately the same as the doping concentration of the first isolation region.

2. The cell of claim 1 wherein the first isolation region and the second isolation region overlap.

3. The cell of claim 1 wherein the second isolation region and the third isolation region overlap.

4. The cell of claim 1 wherein the photodiode region and the row-select region are heavily doped.

5. The cell of claim 1 wherein the doping concentration of the first, second, and third isolation regions is approximately equal to a doping concentration of a low-density drain (LDD) region.

6. An active pixel sensor cell formed on a semiconductor substrate of a first conductivity type, the cell comprising:

a plurality of spaced-apart active regions of a second conductivity type formed in the substrate, the active regions including a photodiode region and a row-select region, the photodiode and row-select regions each having a doping concentration;

a first isolation region of the second conductivity type formed in the substrate to adjoin the photodiode region, the first isolation region having a doping concentration substantially less than the doping concentration of the photodiode region;

a second isolation region of the first conductivity type formed in the substrate to adjoin the first isolation region, the second isolation region having a doping concentration which is approximately the same as the doping concentration of the first isolation region;

a third isolation region formed by an oxide layer on the surface of the substrate to adjoin the second isolation region;

a fourth isolation region of the first conductivity type formed in the substrate to adjoin the third isolation region, the fourth isolation region having a doping concentration which is approximately the same as the doping concentration of the first isolation region; and a fifth isolation region of the second conductivity type formed in the substrate to adjoin the fourth isolation region and the row-select region, the fifth isolation region having a doping concentration which is approximately the same as the doping concentration of the first isolation region.

7. The cell of claim 6 wherein the first isolation region and the second isolation region overlap.

8. The cell of claim 6 wherein the fourth isolation region and the fifth isolation region overlap.

9. The cell of claim 6 wherein the photodiode and row-select regions are heavily doped.

10. The cell of claim 6 wherein the doping concentration of the first, second, fourth, and fifth isolation regions is approximately equal to a doping concentration of a low-density drain (LDD) region.

* * * * *